(12) United States Patent
Yi et al.

(10) Patent No.: US 6,655,042 B2
(45) Date of Patent: Dec. 2, 2003

(54) SYSTEM AND METHOD FOR DRYING SEMICONDUCTOR SUBSTRATE

(75) Inventors: Hun-jung Yi, Suwon (KR); Ki-seok Lee, Daejeon (KR); Bo-yong Lee, Osan (KR); Sang-oh Park, Sungnam (KR); Pil-kwon Jun, Yongin (KR); Sang-mun Chon, Yongin (KR); Kyung-dae Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 17 days.

(21) Appl. No.: 10/060,021

(22) Filed: Jan. 29, 2002

(65) Prior Publication Data

US 2003/0106239 A1 Jun. 12, 2003

(30) Foreign Application Priority Data

Dec. 11, 2001 (KR) .......................... 2001-78159

(51) Int. Cl.⁷ .................................. F26B 3/00
(52) U.S. Cl. ..................... 34/340; 34/329; 34/330; 34/337; 34/351; 34/469; 34/470; 34/451; 34/130; 134/10
(58) Field of Search ................... 34/282, 329, 330, 34/337, 342, 340, 451, 611, 444, 311, 351, 467, 478, 469, 470, 130; 134/902, 10

(56) References Cited

U.S. PATENT DOCUMENTS

| 4,876,801 | A | * | 10/1989 | Gehring et al. | .............. 34/9 |
| 5,268,036 | A | * | 12/1993 | Neubauer et al. | .............. 134/2 |
| 5,884,640 | A | * | 3/1999 | Fishkin et al. | .............. 134/95.2 |
| 5,950,328 | A | * | 9/1999 | Ichiko et al. | .............. 34/364 |
| 6,494,220 | B1 | * | 12/2002 | Matsuda et al. | .............. 134/104.1 |

* cited by examiner

*Primary Examiner*—Ira S. Lazarus
*Assistant Examiner*—Kenneth Rinehart
(74) *Attorney, Agent, or Firm*—F. Chau & Associates, LLC (57) ABSTRACT

A drying system for drying a semiconductor substrate is provided. The drying system includes: a chamber for housing a vapor distributor and a fluid bath, said fluid bath being disposed in a lower portion of the chamber and said distributor being disposed in an upper portion of the chamber for distributing vapor for drying the substrate; and a fluid flow system for supplying fluid flow into said fluid bath for cleaning and drying the substrate and for draining said fluid from the fluid bath, wherein the chamber includes a plurality of exhaust vents disposed at the upper portion for venting the vapor.

35 Claims, 9 Drawing Sheets

SYSTEM AND METHOD FOR DRYING SEMICONDUCTOR SUBSTRATE

BACKGROUND OF THE INVENTION

1. Field of the Invention

The present invention relates to a system and a method for fabricating a semiconductor device, and more particularly to a system and a method for drying a semiconductor substrate.

2. Description of the Related Art

In fabricating highly integrated semiconductor devices, any contamination materials such as particles remaining on semiconductor substrates after cleaning, electrostatic discharge, and water marks or the like, exert an undesirable influence on subsequent process steps and adversely affect device yield. Generally, semiconductor devices are cleaned during fabrication by a wet cleaning process or wet etching process to remove contaminants from semiconductor substrates. After a wet cleaning process, a cleaning process generally is used to remove chemical solution used in the wet process from semiconductor substrates, and a drying process is used to remove fluid such as deionized water used in the cleaning process from the rinsed semiconductor substrates.

Several conventional methods are used to dry the semiconductor substrates, for example, drying by spinning the substrates or by using vapor pressure. The spin drying method spins the substrates and fluid is removed by centrifugal force. The spin drying method has problems in that the semiconductor substrates may break due to the high level of mechanical force exerted on the semiconductor substrates. Further, this process often does not sufficiently dry the semiconductor substrates.

The vapor pressure method generally involves use of isopropyl alcohol (IPA) at low pressure. In addition to pressure, use of the Marangoni principle further dries the substrates. The process holds the fluid flow from lower to higher surface tension regions across a fluid surface to maximize the drying efficiency.

A method and apparatus for drying semiconductor substrates using the Marangoni principle is disclosed in U.S. Pat. No. 5,884,640 and Japanese Patent Laid-Open No. 10-335299. In these proposed methods, fluid is supplied to a bath by flow onto the top surface of the bath and the bath is drained from the bottom through a valve. Vapor is supplied from a gas supply through a plurality of openings adjacent to the bath. Disadvantages of these methods include fluid surface turbulence, i.e., as fluid is flowed onto the fluid surface level, the fluid is disturbed. This causes an uneven drying effect. Thus, drying efficiency of semiconductor substrates using the Marangoni principle may be reduced because uniform meniscus may not be formed on the surface of the substrates during the drying process. Also the fluid level control disclosed may not be capable of providing a continuous fluid supply and drainage. Further, vapor zone above the fluid level in the drying chamber has inadequate spacing to allow uniform distribution of the vapor pressure of isopropyl alcohol. Furthermore, as the fluid and the vapor are recycled, contaminants may be present.

Therefore, it is desirable to have a system and a method for drying semiconductor substrates for uniformly distributing drying gas and stabilizing fluid surface level in a drying chamber, thereby enhancing the Marangoni effect.

SUMMARY OF THE INVENTION

A drying system for drying a semiconductor substrate is provided, which includes: a chamber for housing a vapor distributor and a fluid bath, said fluid bath being disposed in a lower portion of the chamber and said distributor being disposed in an upper portion of the chamber for distributing vapor for drying the substrate; and a fluid flow system for supplying fluid flow into said fluid bath for cleaning and drying the substrate and for draining said fluid from the fluid bath, wherein the chamber includes a plurality of exhaust vents disposed at the upper portion for venting the vapor.

According to an embodiment of the present invention, the plurality of exhaust vents preferably include at least one pair of exhaust vents disposed substantially diametrically opposed to each other. The fluid flow system controls fluid flow and drain in combination with the vapor distributor to effect the Marangoni drying principles. The fluid flow system includes a fluid level controller for adjusting the level of and draining the fluid in said fluid bath, said fluid level controller having means for continuously draining and supplying the fluid from and to said fluid bath during the drying process. The means for continuously draining includes a flex conduit connected to a drain of said fluid bath, and the level of fluid in the fluid bath is adjusted by raising or lowering a portion of the flex conduit.

According to an embodiment of the present invention, the fluid flow system includes a fluid flow buffer for receiving and buffering fluid flow into the fluid bath. The flow buffer is disposed at an upper portion of the fluid bath, said flow buffer being sized and shaped to receive the fluid at an upper portion and release the fluid through a slit at a lower portion. And the fluid flow buffer is disposed at an upper portion of the fluid bath, said flow buffer being sized and shaped to receive the fluid at an upper portion, temporarily hold the fluid, and release the fluid to the fluid bath by overflowing at the upper portion.

According to an embodiment of the present invention, the vapor distributor includes an inner conduit and a coaxial outer conduit, said inner conduit having an open end and a closed end, the open end for receiving vapor flow, said inner conduit having a plurality of uniformly spaced holes aligned along a longitudinal axis for passing the vapor flow received at the open end to the coaxial outer conduit, and said coaxial outer conduit having first and second sets of holes, the first set of holes aligned along a first longitudinal axis and the second set of holes aligned along a second longitudinal axis for passing the vapor flow passed from the inner conduit. First and second longitudinal axes are preferably symmetrical to each other with respect to a vertical axis passing through the center of the inner conduit.

According to an embodiment of the present invention, the drying system further includes a guide disposed beneath the distributor, the guide being sized to have a width smaller than the diameter of the chamber, forming a channel between the guide and the sides of the chamber to pass the vapor from the distributor. The guide includes a bottom surface formed by two sloped sides intersecting at the middle for reflecting the vapor from the channel to the fluid bath.

According to an embodiment of the present invention, the drying system further includes a vapor generator for generating vapor, said vapor generator having an expansion tank, said expansion tank having a heating element for heating a mist and a filter for filtering the mist prior to outputting as vapor to the chamber.

According to an embodiment of the present invention, the drying system further includes a vapor generator for generating vapor, said vapor generator having an expansion tank, a carrier gas conduit, and a nozzle connecting the carrier gas conduit and the expansion tank, said nozzle having a constant diameter therethrough.

According to a preferred embodiment of the present invention, the chamber includes a hood connecting a top cover and the fluid bath, the plurality of exhaust vents being disposed adjacent a top of the hood. The distance between the fluid surface level and the top cover is at least a half diameter of the semiconductor substrate in height.

According to an embodiment of the present invention, the drying system further includes a plurality of bars for retaining the substrate in the fluid bath, said plurality of bars being connected to a controller for selectively raising and lowering the plurality of bars and the substrate in the fluid bath.

According to an embodiment of the present invention, the fluid is deionized water and said vapor includes isopropyl alcohol.

A method of drying a semiconductor substrate is also provide, which includes the steps of: housing in a chamber having a first space and a second space a vapor distributor in the first space and a fluid bath in the second space, said first space and said second space being spatially separated by a hood; and supplying fluid flow into said fluid bath for cleaning and drying the substrate; drying said substrate by mixing vapor injected from said distributor with fluid in said fluid bath and continuously draining fluid from and supplying fluid to the fluid bath.

According to an embodiment of the present invention, the step of drying includes exhausting vapor through exhaust vents disposed at the hood adjacent said first space. The method further includes the step of adjusting the level of fluid in said fluid bath by raising or lowering a portion of a flex conduit connected to a drain of the fluid bath. The method further includes the step of lowering the level of fluid in said fluid bath by lowering a portion of a flex conduit connected to a drain of the fluid bath and raising said substrate in the fluid bath concurrently. The method further includes the step of buffering fluid flow into the fluid bath by a fluid flow buffer.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to on skilled in the art that the present invention can be achieved without the specifications. There will be omission of detailed description about well known functions and structures to clarify key points of the present invention.

Figure 1:
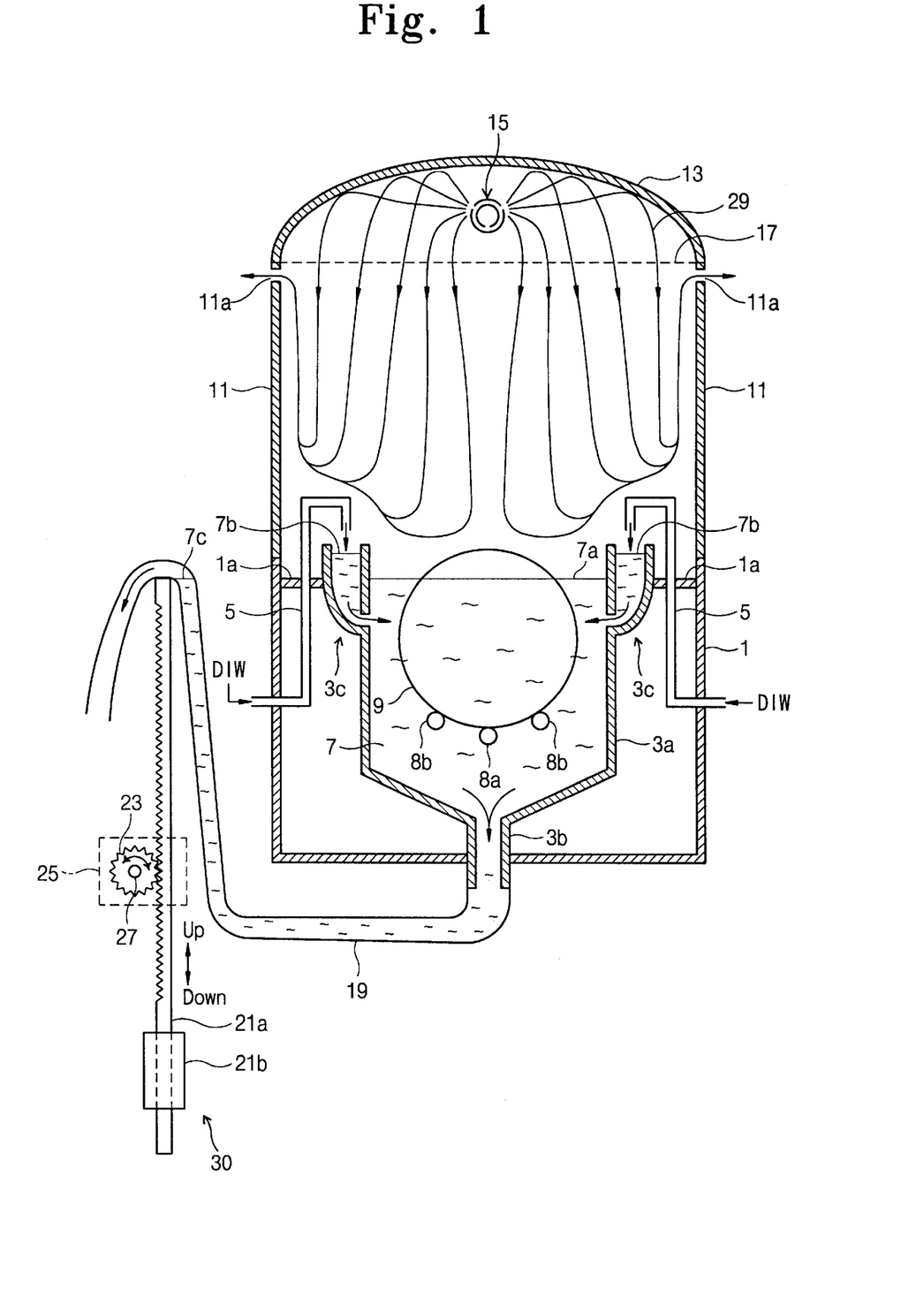
FIG. 1 is a schematic front cross-sectional view for illustrating a cleaning and drying system according to an embodiment of the present invention.
Figure 2:
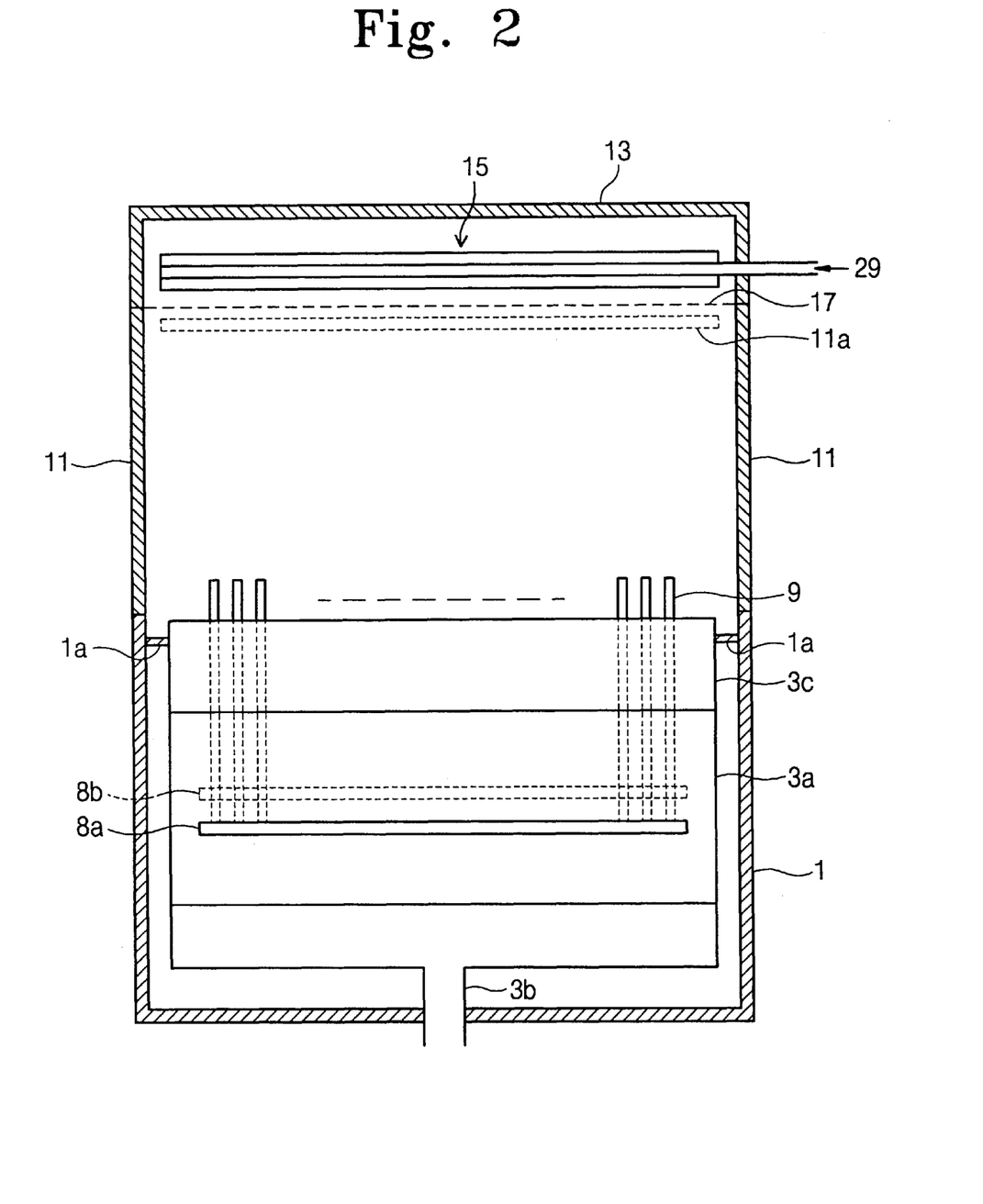
FIG. 2 is a schematic side cross-sectional view for illustrating a cleaning and drying system according to an embodiment of the present invention.

FIGS. 1 and 2 show respective front and side schematic cross-sectional views for illustrating a drying system according to an embodiment of the present invention.

Referring to FIG. 1, the drying system for drying semiconductor substrates 9 includes a chamber 1 and a fluid flow system. The chamber 1 is used for housing a distributor 15 and a fluid bath 3a. The fluid flow system is used for supplying fluid 7 into the fluid bath 3a for washing the substrates 9 and for draining the fluid 7 from the fluid bath 3a.

According to an embodiment of the present invention, the fluid flow system includes a fluid level controller for controllably raising or lowering the level of a flex conduit 19 connected to a drain 3b of the fluid bath 3a. The fluid level controller is used for adjusting the level of and draining the fluid 7 in the fluid bath 3a. The fluid level controller is capable of continuously draining the fluid 7 from the fluid bath 3a during the drying process. Preferably, the level 7a of the fluid 7 is adjusted by raising or lowering a portion of the flex conduit 19. The fluid flow system further includes a fluid flow buffer 3c disposed at an upper portion of the fluid bath 3a. The fluid flow buffer 3c is used for receiving and buffering the fluid 7 into the fluid bath 3a. The fluid flow buffer 3c is sized and shaped to receive the fluid 7 at an upper portion and releases the fluid 7 through a slit at a lower portion. The fluid 7 is continuously supplied into the fluid flow buffer 3c through a fluid conduit 5 connected to the fluid flow buffer 3c. The outlet of the fluid conduit 5 is located over the fluid flow buffer 3c.

Figure 3:
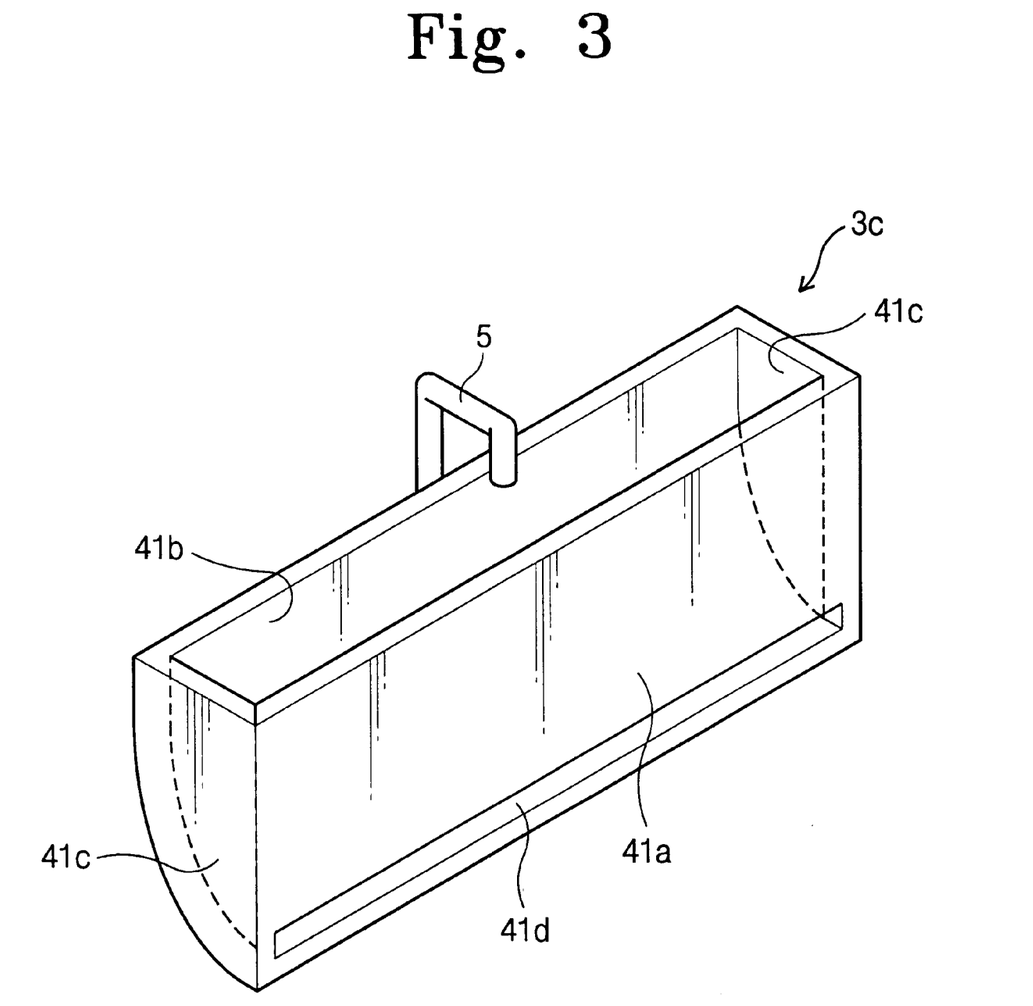
FIG. 3 is a perspective view for illustrating a fluid flow buffer of FIG. 1.

FIG. 3 is a perspective view for illustrating a fluid flow buffer of FIG. 1. Referring to FIG. 3, the fluid flow buffer includes an inner side wall 41a, an outer side wall 41b, and front and back walls 41c. A lower portion of the outer sidewall 41b is preferably curved to enforce fluid flow. Also, a lower portion of the outer wall 41b intersects a lower portion of the vertical inner sidewall 41a at an edge. Thus, the lower portion of the fluid flow buffer is closed without having a flat bottom. According to an embodiment of the present invention, the inner side wall 41a has a slit 41d at a lower portion above the edge.

Referring again to FIG. 1, the fluid 7 in the fluid flow buffer 3c is flowed into the fluid bath 3a through the slit 41d, and the fluid 7 in the fluid bath 3a is flowed out through the flex conduit 19. A fluid surface level 7b in the fluid flow buffer 3c is preferably higher than the fluid surface level 7a in the fluid bath 3a. Advantageously, according to the illustrative embodiment of FIGS. 1 to 3, fresh fluid is always supplied to the fluid bath 3a. In addition, while the fluid bath 3a is continuously supplied and drained with fluid, the fluid surface level 7a remains calm with little surface disturbance because the fluid 7 is supplied into the inside of the fluid bath 3a, not the fluid surface level 7a. Particularly, during drying the substrates 9, meniscus should be formed at a surface of the substrates 9 to enhance the Marangoni effect. If the fluid surface level 7a is unstable, uniform meniscus may not be formed on the surface of the substrates 9 during the drying process.

Figure 4:
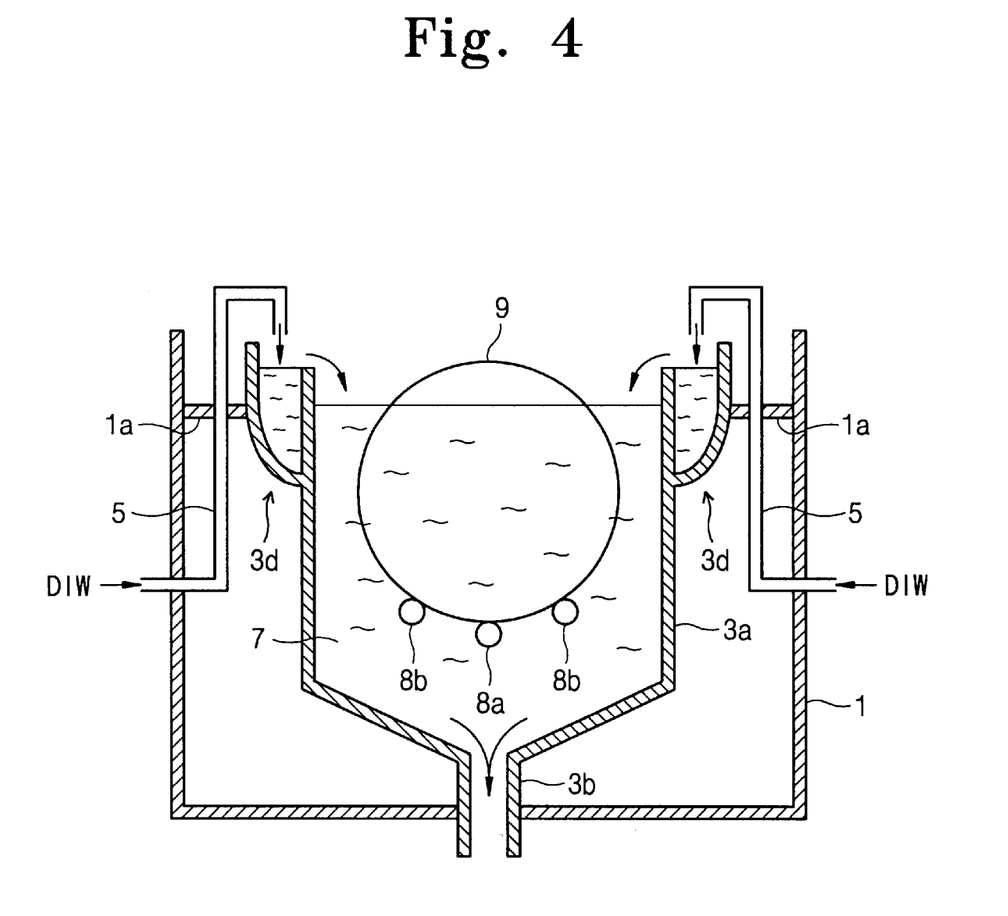
FIG. 4 is a front cross-sectional view for illustrating another type of a fluid buffer according to the present invention.

According to an embodiment of the present invention, the fluid flow buffer 3d can have different shapes, for example, as shown in FIG. 4. Referring to FIG. 4, the fluid flow buffer 3d includes an inner side wall, an outer sidewall, a front wall, and a back wall similar to the fluid flow buffer 3c in FIG. 3. However, the outer wall of the fluid flow buffer 3d is higher than the inner sidewall thereof, and the inner sidewall of the fluid flow buffer 3d does not include a slit shown in FIG. 3. Thus, the fluid 7 is supplied into the fluid bath 3a by overflowing the fluid flow buffer 3d.

Referring back to FIG. 1, the drain 3b of the fluid bath 3a is connected to the flex conduit 19. The flex conduit 19 is supported by a rod 21a. The rod 21a has a plurality of tooth-shaped grooves at a sidewall thereof and is inserted in a substantially vertical guide hole of a supporting block 21b. The tooth-shaped grooves are in a vertical direction. A toothed wheel 23 is installed to be set with the tooth-shaped grooves of the rod 21a, and connected to a motor 25 through a rotating shaft 27. Thus, when the toothed wheel 23 is rotated by the rotating shaft 27, the rod 21a can be move up or down, thereby lifting or lowering the flex conduit 19. As the flex conduit 19 is lifted or lowered, the fluid surface level 7a in the fluid bath 3a can be controlled. Thus, the fluid surface level 7a in the fluid bath 3a can be easily controlled by controlling the motor 25. Although the present embodiment describes the flex conduit 19 is lifted or lowered by lifting or lowering the rod 21a, one skilled in the art can readily appreciate that other means for lifting or lowering the rod 21a can be used. For example, the flex conduit 19 can be lifted or lowered by a rope (not shown) connected to the flex conduit 19, and the rope is controlled by other tool (not shown).

According to a further aspect of the present invention, the chamber 1 includes a distributor 15 for distributing a drying gas 29 for drying the substrates 9 and a fluid bath 3a for storing the fluid 7. The chamber 1 further includes a plurality of exhaust vents 11a disposed at the upper portion of the chamber 1 for venting the drying gas 29 and a plate 17 having a plurality of holes disposed in the upper portion of the chamber 1 and below the distributor 15. Preferably, a plurality of exhaust vents 11a act to vent or exhaust vapor or gas from the chamber 1. The plurality of exhaust vents 11a include at least one pair of exhaust vents disposed substantially diametrically opposed to each other.

Preferably, the chamber 1 is covered with a top cover 13, which can provide a second space positioned at an upper portion of the chamber 1. The top cover 13 is shown to have a round shape, but other shape of the top cover 13 can be used without limitation, for example, the top cover 13 can have a rectangular shape.

According to an embodiment of the invention, the chamber 1 further includes a hood 11 connecting the top cover 13, the hood 11 is disposed between the top cover 13 and the chamber 1. The hood 11 acts to extend or space the distance between the exhaust vents 11a and cover 13 from the fluid bath 3a. Preferably, the distance between the fluid surface level 7b and the top cover 13 including the hood 11 is at least a half diameter of the semiconductor substrate 9 in height, and the plurality of exhaust vents 11a are disposed adjacent a top of the hood 11.

The fluid bath 3a and the fluid buffer unit 3c are fixed inside the chamber 1 by a supporter 1a. The substrates 9 in the fluid bath 3a are supported by a holder (not shown). The holder includes a plurality of bars, preferably at least three bars 8a and 8b for retaining the substrates 9 in the fluid bath 3a. The plurality of bars 8a and 8b extend axially and parallel with one another and with a central axis the substrates 9. For example, the holder may have one central bar 8a and two side bars 8b which are located at both sides of the central bar 8a. The holder is connected to a controller (not shown) for selectively raising and lowering the holder and substrates 9 in the fluid bath 3a.

The distributor 15 is disposed in an upper portion of the chamber 1, preferably, above the plate 17 in the chamber 1. Thus, the drying gas 29 in the upper portion of the chamber 1 flows downward through the plurality of holes of the plate 17 uniformly. The drying gas 29 is then flowed out of the chamber 1 through the plurality of exhaust vents 11a.

Figure 5:
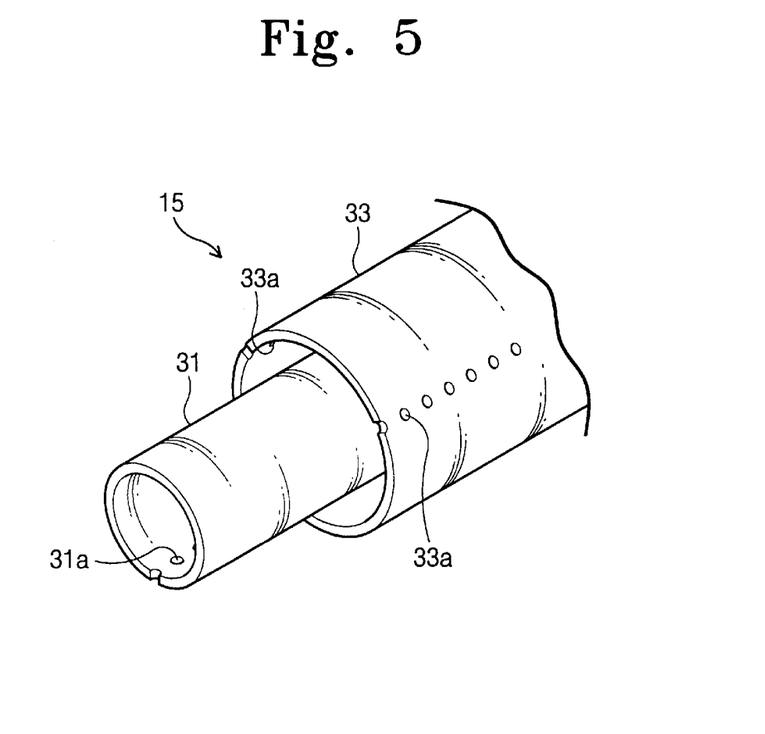
FIG. 5 is a perspective view for illustrating a distributor of FIG. 1.
Figure 6:
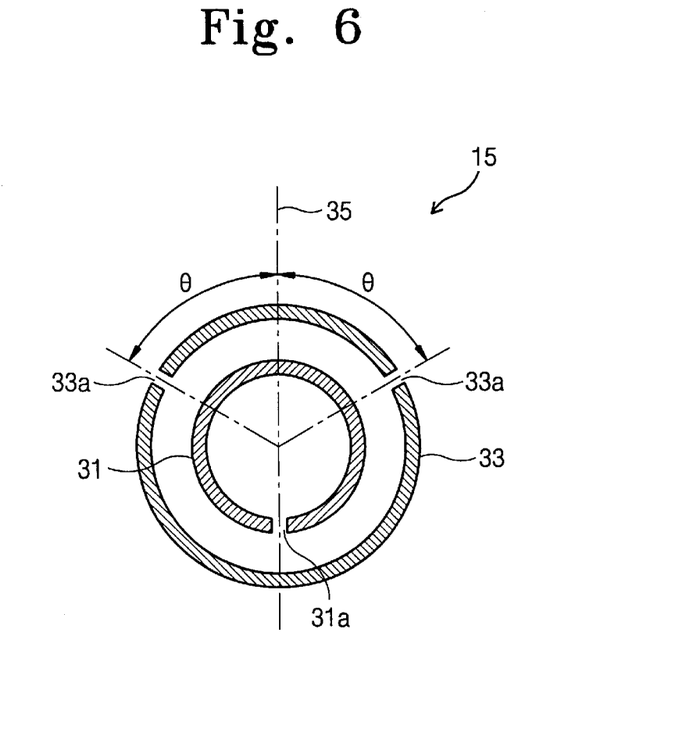
FIG. 6 is a front cross-sectional view for illustrating the distributor of FIG. 5.
Figure 7:
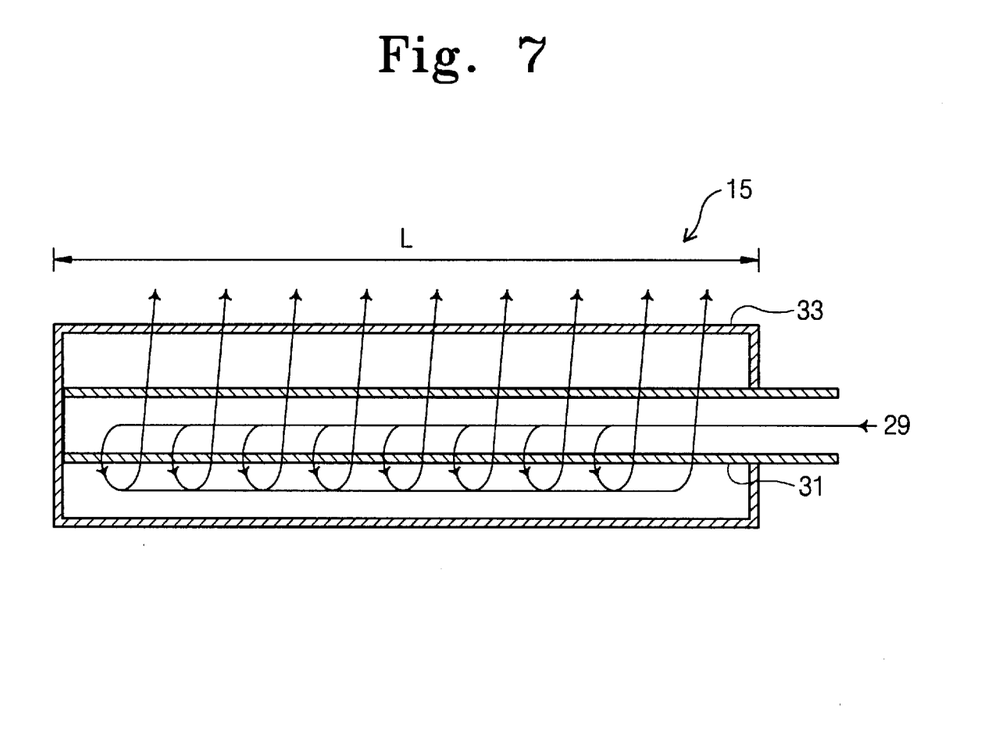
FIG. 7 is a side cross-sectional view for illustrating the distributor of FIG. 5.

FIG. 5 is a perspective view of the distributor 15 shown in FIG. 1, FIG. 6 is a front cross-sectional view of the distributor of FIG. 5, and FIG. 7 is a side cross-sectional view of the distributor of FIG. 5.

Referring to FIGS. 5, 6, and 7, the distributor 15 includes an inner conduit 31 and a coaxial outer conduit 33 surrounding the inner conduit 31. The outer conduit 33 has a length "L". The inner conduit 33 has a plurality of first holes 31a. Preferably, the plurality of first holes 31a are substantially uniformly spaced holes aligned along a longitudinal axis for passing the drying gas 29. The outer conduit 33 also has outer first and second sets of holes 33a. The outer first sets of holes 33a are aligned along a first longitudinal axis and the outer second sets of holes 33a are aligned along a second longitudinal axis for passing the drying gas 29 passed from the inner conduit 31a. Preferably, the first and second longitudinal axes are symmetrical to each other with respect to a vertical axis 35 (in FIG. 6) through the center of the inner conduit 31 (or outer conduit 33). An angle θ between the vertical axis 35 and the second holes 33a arranged on the two lines is preferably greater than about 0 degree and less than about 90 degree. More preferably, the angle θ is in the range of about 30 degree to about 60 degree. Both ends of the outer conduit 33 are closed with a first wall and a second wall, and one end of the inner conduit 31 is also closed with the first wall of the outer conduit 33. The other end of the inner conduit 31 is opened and extended to penetrate the second wall of the outer conduit 33. Thus, the drying gas 29 is flowed out of the distributor 15 through the plurality of first holes 31a and the outer first and second sets of holes 33a.

Figure 8:
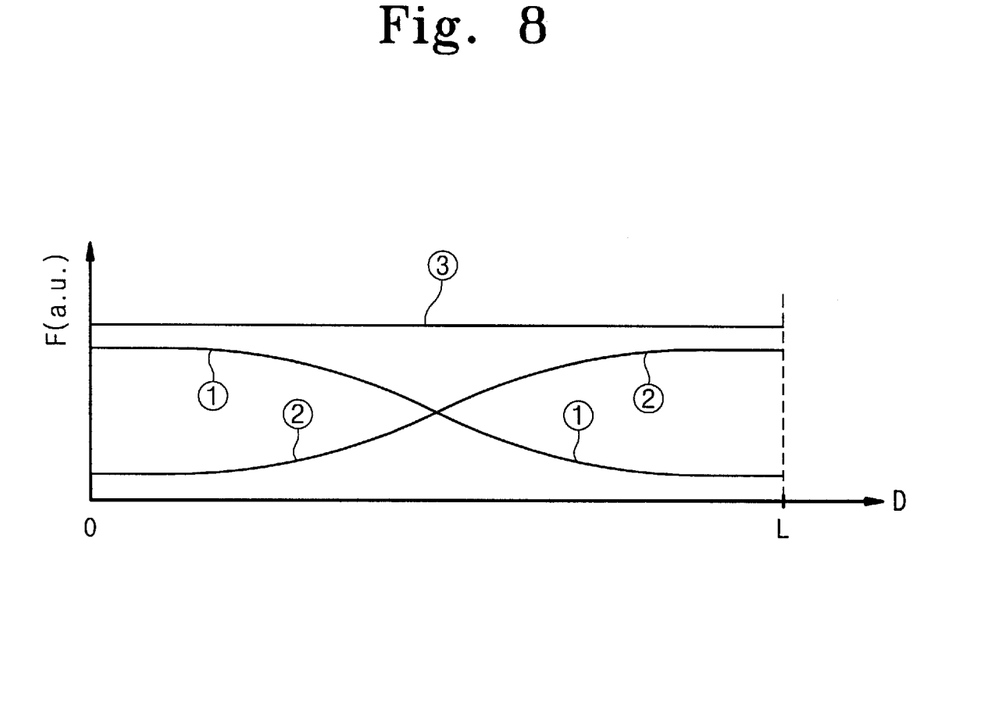
FIG. 8 is a graph for illustrating a uniformity of a drying gas.

FIG. 8 is a graph which illustrates the uniformity of the drying gas flowed out of the distributor of FIGS. 5 to 7. In the drawing of FIG. 8, the horizontal axis represents a distance D from the closed end of the inner conduit toward the opened end of the inner conduit, and the vertical axis represents flux density F of the drying gas.

Referring to FIGS. 7 and 8, the drying gas 29 is introduced into the inner conduit 31 through the opened end. The drying gas 29 is then flowed out of the inner conduit 31 through the plurality of first holes 31a (FIGS. 5 and 6). At this time, as the distance D decreases, the pressure of the drying gas 29 in the inner conduit 31 becomes higher. The flux density F of the drying gas 29, which is flowed out through the plurality of first holes 31a, also increases in proportion to the pressure of the drying gas 29 (refer to curve 1 of FIG. 8). The drying gas 29, which is injected into a space between the inner conduit 31 and the outer conduit 33, is then flowed out of the distributor 15 through the outer first and second sets of holes 33a (FIGS. 5 and 6). In the event that there is no inner conduit 31, the pressure of the drying gas 29 becomes higher as the distance D increases (refer to curve 2 of FIG. 8). Consequently, the total pressure of the drying gas 29 in the space between the inner conduit 31 and the outer conduit 33 is uniform throughout the entire length "L" of the outer conduit 33 (refer to curve 3 of FIG. 8). Accordingly, the amount of a drying gas 29 which flow out through the outer first and second sets of holes 33a is uniform throughout the entire length "L" of the outer conduit 33.

Figure 9:
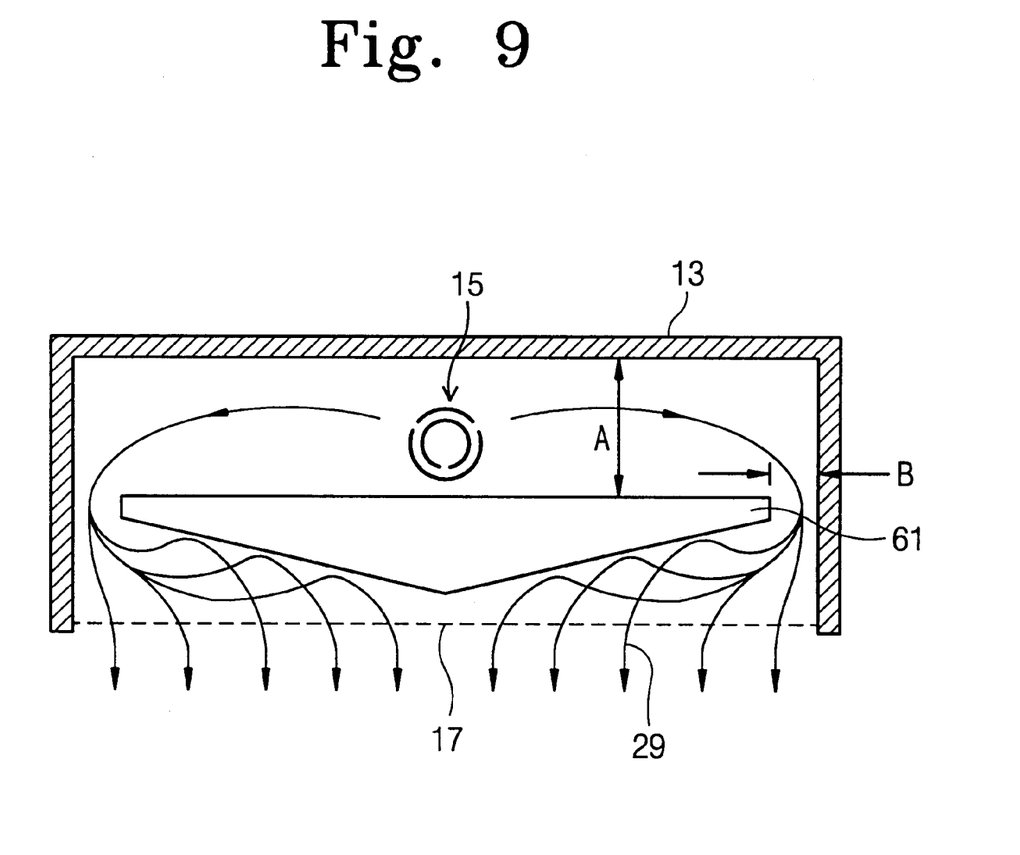
FIG. 9 is a front cross-sectional view for illustrating a distributor and flow guide according to the present invention.

According to an embodiment of the present invention, the distributor 15 can further include a flow guide 61 as shown in FIG. 9 for more uniformly distributing the drying gas 29.

Referring to FIG. 9, the flow guide 61 is preferably disposed beneath the distributor 15 and above the plate 17. The flow guide 61 is sized to have a width smaller than the width of the chamber 1 for forming a channel "B" between the flow guide 61 and the sides of the chamber 1 to pass the drying gas 29 from the distributor 15. The flow guide 61 has a top surface and a bottom surface. The top surface of the flow guide 61 is substantially flat, the bottom surface of the flow guide 61 is formed by two sloped sides intersecting around or at the middle for reflecting the drying gas 29 from the channel "B". According to an embodiment of the present invention, the bottom surface of the flow guide 61 has various shapes such as a convex surface and a convex surface with a flattened on the middle region. As a result, the drying gas 29, which passes through the holes of the plate 17 have more uniform distribution throughout the entire space of the chamber 1. Here, a distance "A" between the top surface of the flow guide 61 and the top of the top cover 13 is preferably greater than or equal to a distance "B" between the flow guide 61 and the sides of the chamber 1. Accordingly, in the event that the flow guide 61 is employed, the Marangoni effect is more enhanced during the drying process.

Figure 10:
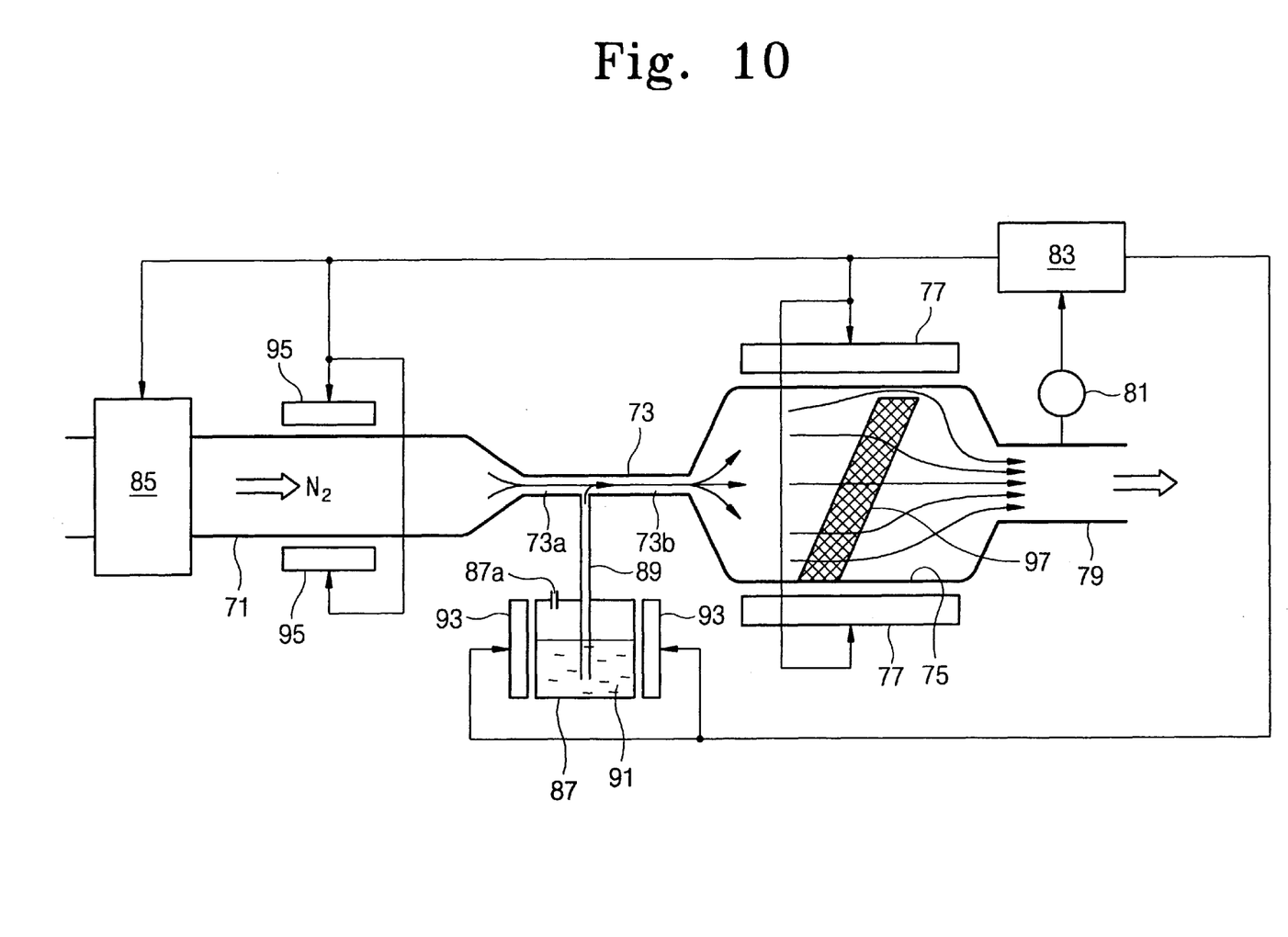
FIG. 10 is a schematic view for illustrating a drying gas generator according to the present invention.

According to the present embodiment of the present invention, the drying system further includes a drying gas generator for generating the drying gas 29 as shown in FIG. 10.

Referring to FIG. 10, the drying gas generator includes an inert gas conduit 71 having an inlet and an outlet. Preferably, the inert gas is a nitrogen gas or helium gas. The outlet of the inert gas conduit 71 is connected to an inlet 73a of a nozzle 73. The nozzle 73 has an inner diameter, which is less than that of the inert gas conduit 71. An outlet 73b of the nozzle 73 is connected to an expansion portion 75. The expansion portion 75 has an inner diameter, which is greater than that of the nozzle 73. An outlet of the expansion portion 75 is connected to a drying gas conduit 79. The drying gas conduit 79 is connected to the distributor 15 (in FIG. 1). Preferably, the inner diameter of the nozzle 73 is substantially constant throughout the entire length of the nozzle 73.

According to an embodiment of the present invention, the drying gas generator further includes a pipe 89, which is branched from a predetermined region of the nozzle 73, and a tank 87 for storing chemical solution 91. The chemical solution 91 includes methanol, ethanol, propanol, butanol, isopropyl alcohol (IPA), or acetone which are miscible with the fluid 7 (in FIG. 1) such as deionized water to lower its surface tension and enhance the Marangoni effect. For example, methanol has surface tension of about 24 dyne/cm, ethanol has surface tension of about 24.1 dyne/cm, isopropyl alcohol (IPA) has surface tension of about 22.9 dyne/cm, and acetone has surface tension of about 26.3 dyne/cm. The tank 87 has a hole 87a disposed on a top portion thereof. The pressure in the tank 87 is kept at about one atmosphere due to the presence of the hole 87a. In the event that the nitrogen gas is blown into the inert gas conduit 71, the pressure in the nozzle 73 is lower than about one atmosphere. Thus, the chemical solution 91 in the tank 87 is jetted into the nozzle 73 through the pipe 89. As a result, the chemical solution 91 is changed into a vapor gas. However, the vapor gas may have small drops of the chemical solution. Once the vapor gas reaches at the expansion portion 75, the volume of the vapor gas is abruptly expanded. Accordingly, the vapor gas is completely evaporated to generate a drying gas 29 (in FIG. 1) having high and uniform concentration. The drying gas 29 (in FIG. 1) is then flowed into the distributor 15 (in FIG. 1) through the drying gas conduit 79 connected to the distributor 15 (in FIG. 1).

The drying gas generator may further include a filter 97 made of porous material and a filter heater 77 for heating the filter 97. The filter 97 is installed in the expansion portion 75 and the filter heater 77 is installed outside the expansion portion 75. The evaporation of the vapor gas is rather promoted by heating the filter 97. In addition, the filter 97 is preferably spaced apart from a portion of the inner wall of the expansion portion 75 to prevent the pressure of the vapor gas in the nozzle 73 from being increased. The filter heater 77 is controlled by a control unit 83.

It is preferable that an inert gas heater 95 is installed outside the inert gas conduit 71 and a chemical solution heater 93 is installed outside the tank 87. Also, a mass flow controller 85 is preferably installed at a predetermined region in the inert gas conduit 71 to control a flow rate of the inert gas. Furthermore, a sensor 81 such as an infrared sensor may be installed at the drying gas conduit 79. The sensor 81 measures concentration of the drying gas that passes through the drying gas conduit 79 and converts the measured concentration into an electrical signal. The electrical signal is transmitted to the control unit 83. The control unit 83 may control the mass flow controller 85, the inert gas heater 95 and the chemical solution heater 93 as well as the filter heater 77 to continuously adjust the concentration of the drying gas 29 (in FIG. 1) to a desired value.

Figure 11:
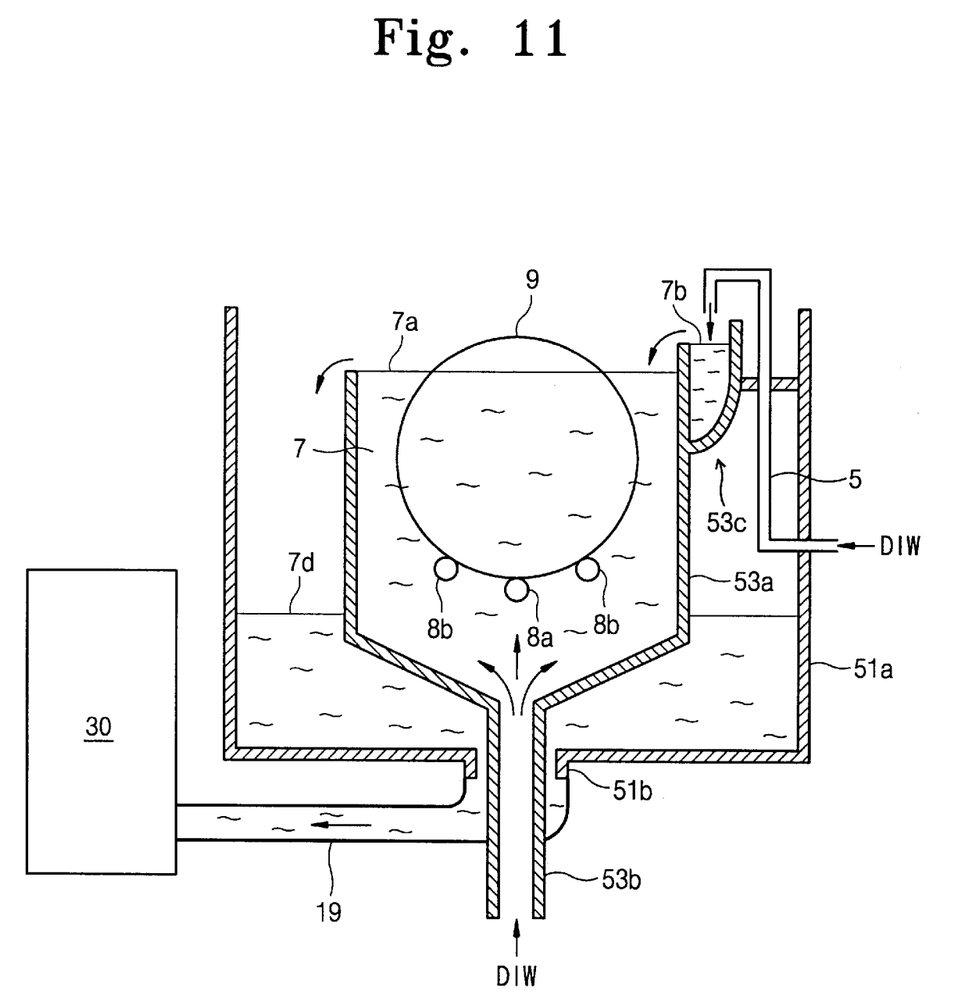
FIG. 11 is a front cross-sectional view for illustrating another embodiment of drying system according to the present invention.

FIG. 11 shows another embodiment of a drying system according to the present invention.

Referring to FIG. 11, the drying system for drying semiconductor substrates 9 includes a chamber 51a and a fluid flow system. The chamber 51a is used for housing a distributor (not shown) and a fluid bath 53a like FIG. 1, and used for draining the fluid 7 from the fluid bath 53a. The fluid flow system is used for supplying fluid 7 into the fluid bath 53a for washing the substrates 9.

Referring to FIG. 11, the chamber 51a has an outlet 51b branched from the bottom of the chamber 51a. The outlet 51b is connected to a flex conduit 19 connected to an exhaust unit 30. Preferably, the exhaust unit 30 includes a rod having a plurality of tooth-shaped grooves at a sidewall, toothed wheel being set with the tooth-shaped grooves of the rod and connected to a motor through a rotating shaft, similar to the embodiment as explained for FIG. 1.

The fluid bath 53a is located inside the chamber 51a. In addition, the fluid bath 53a has an inlet 53b, which is branched from the bottom thereof. The inlet 53b of the fluid bath 53a is extended to penetrate the bottom of the chamber 51a. Fluid 7 such as deionized water or chemical solution is supplied into the fluid bath 53a through the inlet 53b.

A fluid flow buffer 53c is disposed at an upper portion of the fluid bath 53a. The fluid flow buffer 53c has the similar configuration as one of the fluid flow buffer 3d shown in FIG. 4. Alternatively, though not shown in FIG. 11, the fluid flow buffer 53c can have the same configuration as one of the fluid buffer units 3c shown in FIG. 1. Also, the other sidewall of the fluid bath 53a opposite the fluid flow buffer 53c is lower than one side sidewall of the fluid flow buffer 53c as shown in FIG. 11. Thus, the fluid 7 is flowed into the fluid bath 53a through the inlet 53b and the fluid flow buffer 53c, and the fluid 7 in the fluid bath 53a is flowed out by overflowing the low sidewall of the fluid bath 53a. As a result, the fluid 7 is stored in the chamber 51a, and the fluid 7 stored in the chamber 51a is drained through the exhaust unit 30 through the flex conduit 19. In this case, the highest region of the flexible conduit is preferably controlled to be higher than the bottom of the chamber 51a. In other words, a surface level 7d of the fluid in the chamber 51a is preferably higher than the bottom of the chamber 51a. This is for increasing the concentration and the uniformity of the drying gas 29 by closing the bottom of the chamber.

Other units having the same numbers such as a distributor and exhaust vents are the same as the FIG. 1. Detailed description will therefore be omitted.

Next, a method of cleaning and drying the substrates 9 will be explained with reference to FIG. 1.

First, the substrates 9 are loaded into the fluid bath 3a. Fluid 7 such as deionized water is continuously supplied into the fluid bath 3a through the fluid flow buffer 3c. The fluid flow buffer 3c disposed at an upper portion of the fluid bath 3a is used for receiving and buffering the fluid 7 into the fluid bath 3a. The fluid 7 is supplied into the fluid flow buffer 3c through a fluid conduit 5 connected to the fluid flow buffer 3c. The fluid flow buffer 3c releases the fluid 7 through a slit 41d (in FIG. 3) at a lower portion. The fluid 7 is continuously drained through the drain 3b connected to the flex conduit 19 for cleaning the substrates 9. By lifting or lowering the flex conduit 19, the fluid surface level 7a in the fluid bath 3a can be controlled. When the drying system in FIG. 11 is used for drying the substrates 9, the fluid 7 is continuously supplied through fluid flow buffer 53c (in FIG. 11) disposed at an upper portion of the fluid bath 53a (in FIG. 11) and the inlet 53b connected at an lower portion of the fluid bath 53a (in FIG. 11). And the fluid 7 is continuously drained through the outlet 51b (in FIG. 11) in the bottom of the chamber 51a. By continuously supplying and draining the fluid 7, the fluid 7 is kept fresh in the fluid bath 3a.

After cleaning the substrates 9, the drying gas 29 is continuously supplied over the fluid 7 in the fluid bath 3a through the distributor 15 disposed for uniformly distributing the drying gas 29 and continuously vented through a plurality of exhaust vents 11a disposed at the upper portion of sidewall of the chamber 1. The concentration of the drying gas 29 in the chamber 1 can be controlled by continuously supplying and venting the drying gas 29.

The drying gas 29 is generated by using the drying gas generator as shown in FIG. 10. The drying gas 29 includes an inert gas such as nitrogen gas or helium gas and a predetermined amount of chemicals. Preferably, the chemicals include alcohol selected from the group consisting of methanol, ethanol, propanol, butanol, and isopropyl alcohol (IPA), and acetone. More preferably, the chemical is isopropyl alcohol (IPA). The chemicals are miscible with the fluid 7 such as deionized water to lower its surface tension and enhance the Marangoni effect.

Concurrently, the fluid 7 is continuously drained through the drain 3b by lowering the flex conduit 19 and supplied to the fluid bath 3a for refreshing the fluid 7. Concurrently, the substrates 9 are slowly lifted up. Thus, it is possible to prevent a vortex of the fluid 7 from being created. As a result, fresh fluid 7 is continuously supplied to the fluid bath 3a and the surface level 7a of the fluid 7 is stabilized. Therefore, the Marangoni effect is maximized to improve the drying process.

Furthermore, during the drying process, the fluid 7 passes through the gap region between the substrates 9 and flows out of the fluid bath 3a through the outlet 3b. Thus, the rate of the running fluid at the upper gap region is higher than the rate of the running fluid at the bottom gap region. Accordingly, particles can more easily be detached from the substrates 9.

According to the present invention as stated above, uniform and maximum concentration of the drying gas is achieved due to the presence of the drying gas generator having the expansion portion. Also, the drying gas is uniformly supplied throughout the entire surface of the fluid such as deionized water in the fluid bath using the distributor having a double conduit structure. In addition, the surface level of the fluid is stabilized in the fluid bath by employing the fluid buffer unit(s). Further, the drying gas is more uniformly distributed over the chamber by closing up the bottom of the chamber and continuously venting the drying gas through the exhaust vents. As a result, the Marangoni effect is maximized.

Although the present invention has been described herein with reference to the accompanying drawings, it is to be understood that the present invention is not limited to those precise embodiments, and various other changes and modifications may be affected therein by one skilled in the art without departing from the scope or spirit. It will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. A method of drying a semiconductor substrate, comprising the steps of:

housing in a chamber having a first space and a second space a vapor distributor in the first space and a fluid bath in the second space, said first space and said second space being spatially separated by a hood;

supplying fluid into said fluid bath for cleaning and drying the substrate; and drying said substrate by mixing vapor injected from said distributor with fluid in said fluid bath and continuously draining fluid from and supplying fluid to the fluid bath; and channeling vapor injected from the distributor through a guide disposed beneath the distributor, the guide being sized to have a width smaller than the diameter of the chamber, forming a channel between the guide and the sides of the chamber to pass the vapor from the distributor.

2. The method of claim 1, wherein said guide includes a bottom surface formed by two sloped sides intersecting at the middle for reflecting the vapor from the channel to the fluid bath.

3. A method of drying a semiconductor substrate, comprising the steps of: housing in a chamber having a first space and a second space a vapor distributor in the first space and a fluid bath in the second space, said first space and said second space being spatially separated by a hood;

supplying fluid into said fluid bath for cleaning and drying the substrate; and drying said substrate by mixing vapor injected from said distributor with fluid in said fluid bath and continuously draining fluid from and supplying fluid to the fluid bath; and generating vapor using a vapor generator, said vapor generator having an expansion tank, said expansion tank having a filter to filtering the mist prior to outputting as vapor to the chamber.

4. The method according to claim 3, further including the step of connecting a carrier gas conduit and the expansion tank by a nozzle, said nozzle having a constant diameter therethrough.

5. A method of drying a semiconductor substrate, comprising the steps of:

housing in a chamber having a first space and a second space a vapor distributor in the first space and a fluid bath in the second space, said first space and said second space being spatially separated by a hood;

buffering said fluid into the fluid bath by a fluid flow buffer, wherein the flow buffer is disposed at an upper portion of the fluid bath, said flow buffer being sized and shaped to receive fluid at an upper portion for buffering and then releasing the fluid to the fluid bath;

supplying fluid into said fluid bath through the fluid flow buffer for cleaning and drying the substrate; and drying said substrate by mixing vapor injected from said distributor with fluid in said fluid bath and continuously draining fluid from and supplying fluid to the fluid bath, wherein the fluid flow buffer temporarily hold the fluid and release the fluid to the fluid bath by overflowing at the upper portion.

6. The method according to claim 5, wherein said step of drying includes selectively raising and lowering the substrate in the fluid bath.

7. The method according to claim 5, wherein said fluid is deionized water and said vapor includes isopropyl alcohol.

8. A method of drying a semiconductor substrate, comprising the steps of:

housing in a chamber having a first space and a second space a vapor distributor in the first space and a fluid bath in the second space, said first space and said second space being spatially separated by a hood;

buffering said fluid into the fluid bath by a fluid flow buffer, wherein the flow buffer is disposed at an upper portion of the fluid bath, said flow buffer being sized and shaped to receive fluid at an upper portion for buffering and then releasing the fluid to the fluid bath;

supplying fluid into said fluid bath through the fluid flow buffer for cleaning and drying the substrate; and drying said substrate by mixing vapor injected from said distributor with fluid in said fluid bath and continuously draining fluid from and supplying fluid to the fluid bath, wherein the chamber includes an outer bath for receiving fluid overflowing from the fluid bath, said fluid bath having an opening at a bottom portion for receiving fluid flow.

9. The method according to claim 8, wherein said step of drying includes selectively raising and lowering the substrate in the fluid bath.

10. The method according to claim 8, wherein said fluid is deionized water and said vapor includes isopropyl alcohol.

11. A method of drying a semiconductor substrate, comprising the steps of:

housing in a chamber having a first space and a second space a vapor distributor in the first space and a fluid bath in the second space, said first space and said second space being spatially separated by a hood;

supplying fluid into said fluid bath for cleaning and drying the substrate; and drying said substrate by mixing vapor injected from said distributor with fluid in said fluid bath and continuously draining fluid from and supplying fluid to the fluid bath, wherein said step of drying by injecting vapor from said distributor includes injecting vapor through an inner conduit and a coaxial outer conduit of said distributor, said inner conduit having an open end and a closed end, the open end for receiving vapor flow, said inner conduit having a plurality of substantially uniformly spaced holes aligned along a longitudinal axis for passing the vapor flow received at the open end to the coaxial outer conduit, and said coaxial outer conduit having first and second sets of holes, the first set of holes aligned along a first longitudinal axis and the second set of holes aligned along a second longitudinal axis for passing the vapor flow passed from the inner conduit.

12. The method according to claim 11, wherein the first and second longitudinal axes are symmetrical to each other with respect to a vertical axis passing through the center of the inner conduit.

13. A method of drying a semiconductor substrate, comprising the steps of:

housing in a chamber having a first space and a second space a vapor distributor in the first space and a fluid bath in the second space, said first space and said second space being spatially separated by a hood;

buffering said fluid into the fluid bath by a fluid flow buffer, wherein the flow buffer is disposed at an upper portion of the fluid bath, said flow buffer being sized and shaped to receive fluid at an upper portion for buffering and then releasing the fluid to the fluid bath;

supplying fluid into said fluid bath through the fluid flow buffer for cleaning and drying the substrate;

drying said substrate by mixing vapor injected from said distributor with fluid in said fluid bath and continuously draining fluid from and supplying fluid to the fluid bath and adjusting the level of fluid in said fluid bath by raising or lowering a portion of a flex conduit connected to a drain of the fluid bath.

14. The method according to claim 13, wherein said step of drying includes exhausting vapor through exhaust vents disposed at the hood adjacent said first space.

15. The method according to claim 13, further including the step of lowering the level of fluid in said fluid bath by lowering a portion of a flex conduit connected to a drain of the fluid bath and raising said substrate in the fluid bath concurrently.

16. The method according to claim 13, wherein the flow buffer release the fluid at a lower portion of the flow buffer.

17. The method according to claim 13, wherein said step of drying includes selectively raising and lowering the substrate in the fluid bath.

18. The method according to claim 13, wherein said fluid is deionized water and said vapor includes isopropyl alcohol.

19. A drying system for drying a semiconductor substrate, comprising:
- a chamber for housing a vapor distributor and a fluid bath, said fluid bath being disposed in a lower portion of the chamber and said distributor being disposed in an upper portion of the chamber for distributing vapor for drying the substrate; and
- a fluid flow system for supplying fluid into said fluid bath for cleaning and drying the substrate and for draining said fluid from the fluid bath, wherein the chamber includes a plurality of exhaust vents disposed at the upper portion for venting the vapor, further including a vapor generator for generating vapor, said vapor generator includes an expansion tank, said expansion tank having a filter for filtering the mist prior to outputting as vapor to the chamber.

20. The system of claim 19, further including a carrier gas conduit, and a nozzle connecting the carrier gas conduit and the expansion tank, said nozzle having a constant diameter therethrough.

21. A drying system for drying a semiconductor substrate, comprising:
- a chamber for housing a vapor distributor and a fluid bath, said fluid bath being disposed in a lower portion of the chamber and said distributor being disposed in an upper portion of the chamber for distributing vapor for drying the substrate; and
- a fluid flow system for supplying fluid into said fluid bath for cleaning and drying the substrate and for draining said fluid from the fluid bath, wherein the chamber includes a plurality of exhaust vents disposed at the upper portion for venting the vapor, wherein said vapor distributor includes an inner conduit and a coaxial outer conduit, said inner conduit having an open end and a closed end, the open end for receiving vapor flow, said inner conduit having a plurality of substantially uniformly spaced holes aligned along a longitudinal axis for passing the vapor flow received at the open end to the coaxial outer conduit, and said coaxial outer conduit having first and second sets of holes, the first set of holes aligned along a first longitudinal axis and the second set of holes aligned along a second longitudinal axis for passing the vapor flow passed from the inner conduit.

22. The system of claim 21, wherein first and second longitudinal axes are symmetrical to each other with respect to a vertical axis passing through the center of the inner conduit.

23. The system of claim 21, further including a guide disposed beneath the distributor, the guide being sized to have a width smaller than the diameter of the chamber, forming a channel between the guide and the sides of the chamber to pass the vapor from the distributor.

24. The system of claim 23, wherein said guide includes a bottom surface formed by two sloped sides intersecting at the middle for reflecting the vapor from the channel to the fluid bath.

25. The system of claim 23, wherein said guide includes a convex bottom portion for reflecting the vapor from the channel to the fluid bath.

26. A drying system for drying a semiconductor substrate, comprising:
- a chamber for housing a vapor distributor and a fluid bath, said fluid bath being disposed in a lower portion of the chamber and said distributor being disposed in an upper portion of the chamber for distributing vapor for drying the substrate;
- a fluid flow buffer connected to an upper portion of the fluid bath in the chamber, wherein the fluid flow buffer being sized and shaped to receive fluid at an upper portion thereof and release the fluid to the fluid bath;
- a fluid flow system for supplying fluid into said fluid bath through the fluid flow buffer for cleaning and drying the substrate and for draining said fluid from the fluid bath, wherein the chamber includes a plurality of exhaust vents disposed at the upper portion for venting the vapor,
- wherein the fluid flow system includes a fluid level controller for adjusting the level of and draining the fluid in said fluid bath, said fluid level controller having means for continuously draining and supplying the fluid from and to said fluid bath during the drying process; and
- wherein said means for continuously draining includes a flex conduit connected to a drain of said fluid bath, and the level of fluid in the fluid bath is adjusted by raising or lowering a portion of the flex conduit.

27. The drying system of claim 26, wherein the plurality of exhaust vents include at least one pair of exhaust vents disposed substantially diametrically opposed to each other.

28. The drying system of claim 26, wherein the fluid flow system controls fluid flow and drain in combination with the vapor distributor to effect the Marangoni drying principles.

29. The system of claim 26, wherein the flow buffer release the fluid through a lower portion of the flow buffer.

30. The system of claim 26, wherein the flow buffer temporarily hold the fluid, and release the fluid to the fluid bath by overflowing at the upper portion.

31. The system of claim 26, wherein the chamber includes an outer bath for receiving fluid overflowing from the fluid bath, said fluid bath having an opening at a bottom portion for receiving fluid flow.

32. The system of claim 26, wherein the chamber includes a hood connecting a top cover and the fluid bath, the plurality of exhaust vents being disposed adjacent a top of the hood.

33. The system of claim 32, wherein the distance between the fluid surface level and the top cover is at least a half diameter of the semiconductor substrate in height.

34. The system of claim 26, further including a plurality of bars for retaining the substrate in the fluid bath, said plurality of bars being connected to a controller for selectively raising and lowering the plurality of bars and the substrate in the fluid bath.

35. The system of claim 26, wherein said fluid is deionized water and said vapor includes isopropyl alcohol.

* * * * *